United States Patent
Sun

(10) Patent No.: US 8,248,796 B2
(45) Date of Patent: Aug. 21, 2012

(54) SERVER HEAT DISSIPATION SYSTEM

(75) Inventor: Zheng-Heng Sun, Taipei Hsien (TW)

(73) Assignee: Hon Hai Precision Industry Co., Ltd., Tu-Cheng, New Taipei (TW)

( * ) Notice: Subject to any disclaimer, the term of this patent is extended or adjusted under 35 U.S.C. 154(b) by 123 days.

(21) Appl. No.: 12/873,104

(22) Filed: Aug. 31, 2010

(65) Prior Publication Data
US 2011/0267770 A1  Nov. 3, 2011

(30) Foreign Application Priority Data
Apr. 29, 2010 (CN) .......................... 2010 1 0159605

(51) Int. Cl.
*H05K 7/20* (2006.01)

(52) U.S. Cl. ....................... 361/695; 361/694

(58) Field of Classification Search ................... None
See application file for complete search history.

(56) References Cited

U.S. PATENT DOCUMENTS

| | | | |
|---|---|---|---|
| 6,765,795 B2 * | 7/2004 | Modica | 361/695 |
| 7,023,696 B2 * | 4/2006 | Ko | 361/695 |
| 2002/0108386 A1 * | 8/2002 | Spinazzola et al. | 62/259.2 |
| 2008/0180908 A1 * | 7/2008 | Wexler | 361/690 |
| 2009/0308579 A1 * | 12/2009 | Johnson et al. | 165/104.34 |
| 2010/0078157 A1 * | 4/2010 | Roth | 165/104.34 |
| 2010/0151781 A1 * | 6/2010 | Slessman et al. | 454/184 |
| 2011/0267767 A1 * | 11/2011 | Sun | 361/679.46 |

* cited by examiner

*Primary Examiner* — Gregory Thompson
(74) *Attorney, Agent, or Firm* — Altis Law Group, Inc.

(57) ABSTRACT

A server heat dissipating system includes two server assemblies, an airflow producing device configured to produce airflow, and a main airflow guiding pipe. Each server assembly includes a server cabinet configured to receive a first server and an airflow guiding device. The airflow guiding device is configured to guide airflow to the first server to dissipate heat generated by the first server. The main airflow guiding pipe is connected to the two airflow guiding devices to guide airflow from the airflow producing device to the airflow guiding devices.

20 Claims, 6 Drawing Sheets

SERVER HEAT DISSIPATION SYSTEM

This application is related to co-pending U.S. Patent Applications entitled "SERVER ASSEMBLY", U.S. application Ser. No. 12/873,093 filed on Aug. 31, 2010.

BACKGROUND

1. Technical Field

The present disclosure relates to server heat dissipation systems.

2. Description of Related Art

A number of servers can be mounted in a server cabinet. Each server will include its own heat dissipating device configured only for dissipating the heat it produces, which lacks efficiency overall in the server cabinet. Also, because there are many heat dissipating devices and each include one or more fans, a lot of noise is produced.

DETAILED DESCRIPTION

The disclosure is illustrated by way of example and not by way of limitation in the figures of the accompanying drawings in which like references indicate similar elements. It should be noted that references to "an" or "one" embodiment in this disclosure are not necessarily to the same embodiment, and such references mean at least one.

Figure 1:
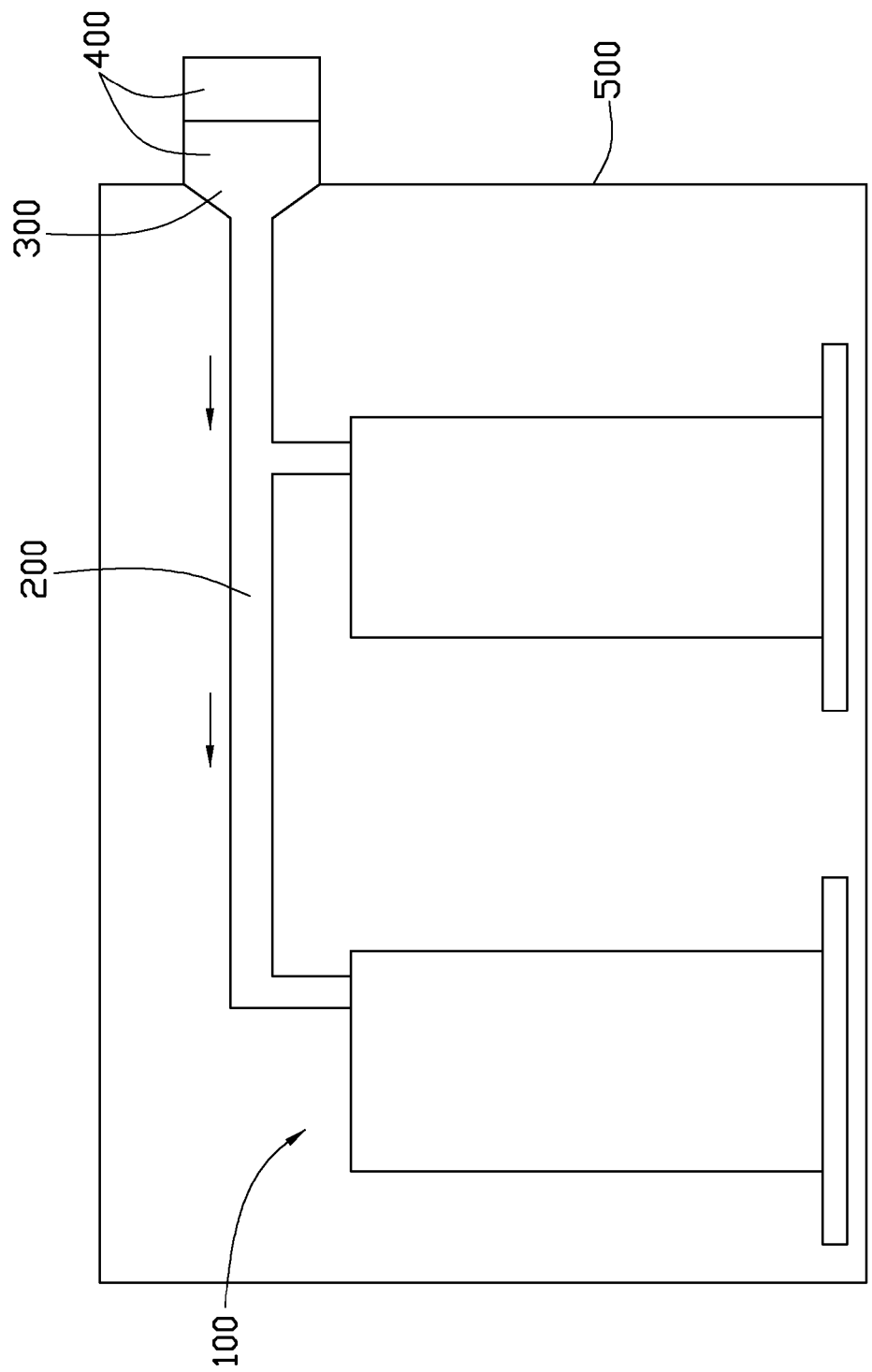
FIG. 1 is a schematic view of a server heat dissipation system of an embodiment.

Referring to FIG. 1 a server heat dissipation system includes two server assemblies 100, a main airflow guiding pipe 200, a main airflow duct 300, and an airflow producing device 400. In one embodiment, the airflow producing device 400 includes a fan and an air filter. The main airflow duct 300 is funnel-shaped. The main airflow guiding pipe 200 is connected to the two server assemblies 100. The two server assemblies 100, the main airflow guiding pipe 200, and the main airflow duct 300 are disposed inside a room 500. The airflow producing device 400 is disposed outside of the room 500.

Figure 2:
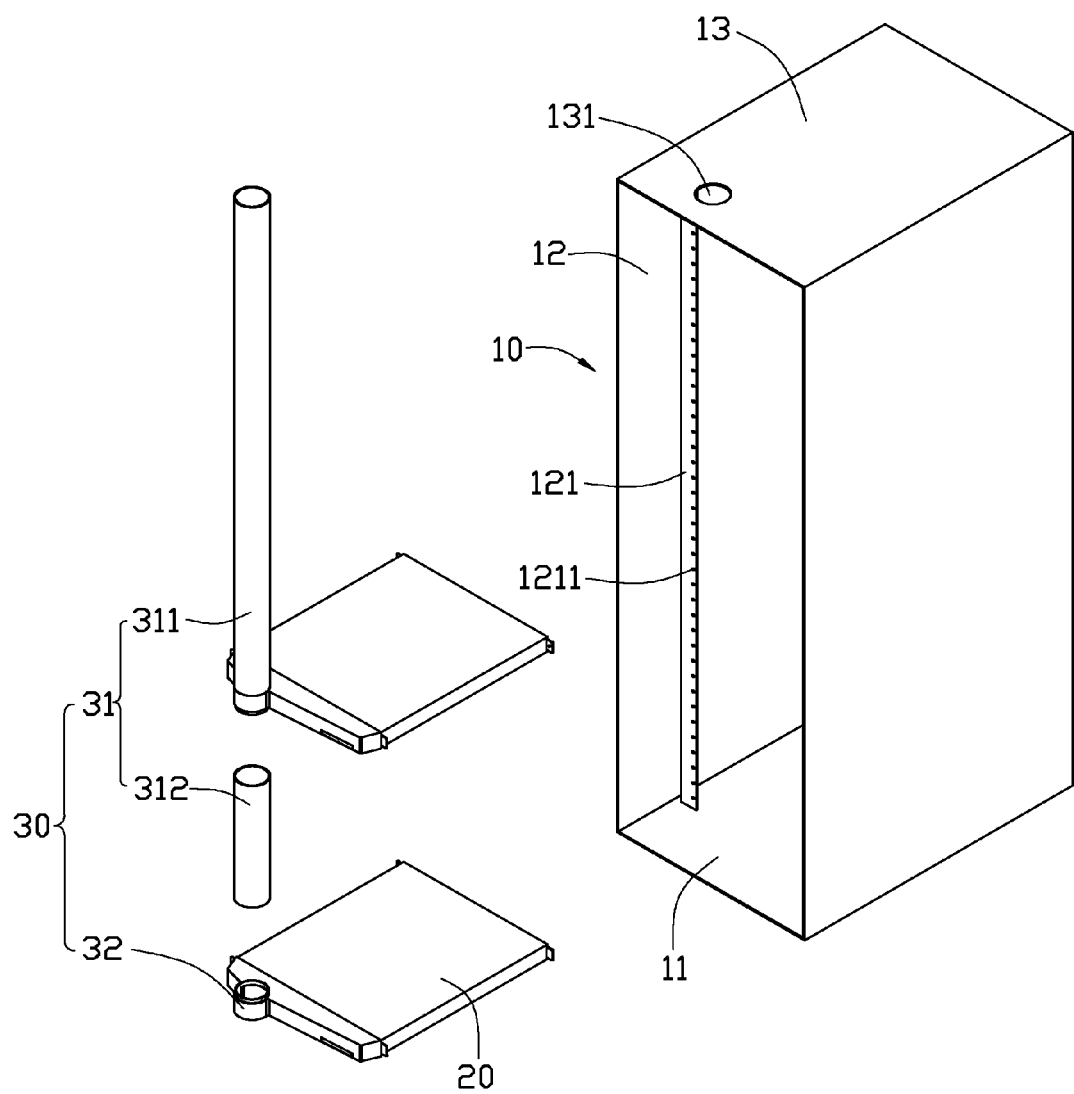
FIG. 2 is an exploded, isometric view of a server assembly of FIG. 1, the server assembly including airflow ducts and servers.
Figure 3:
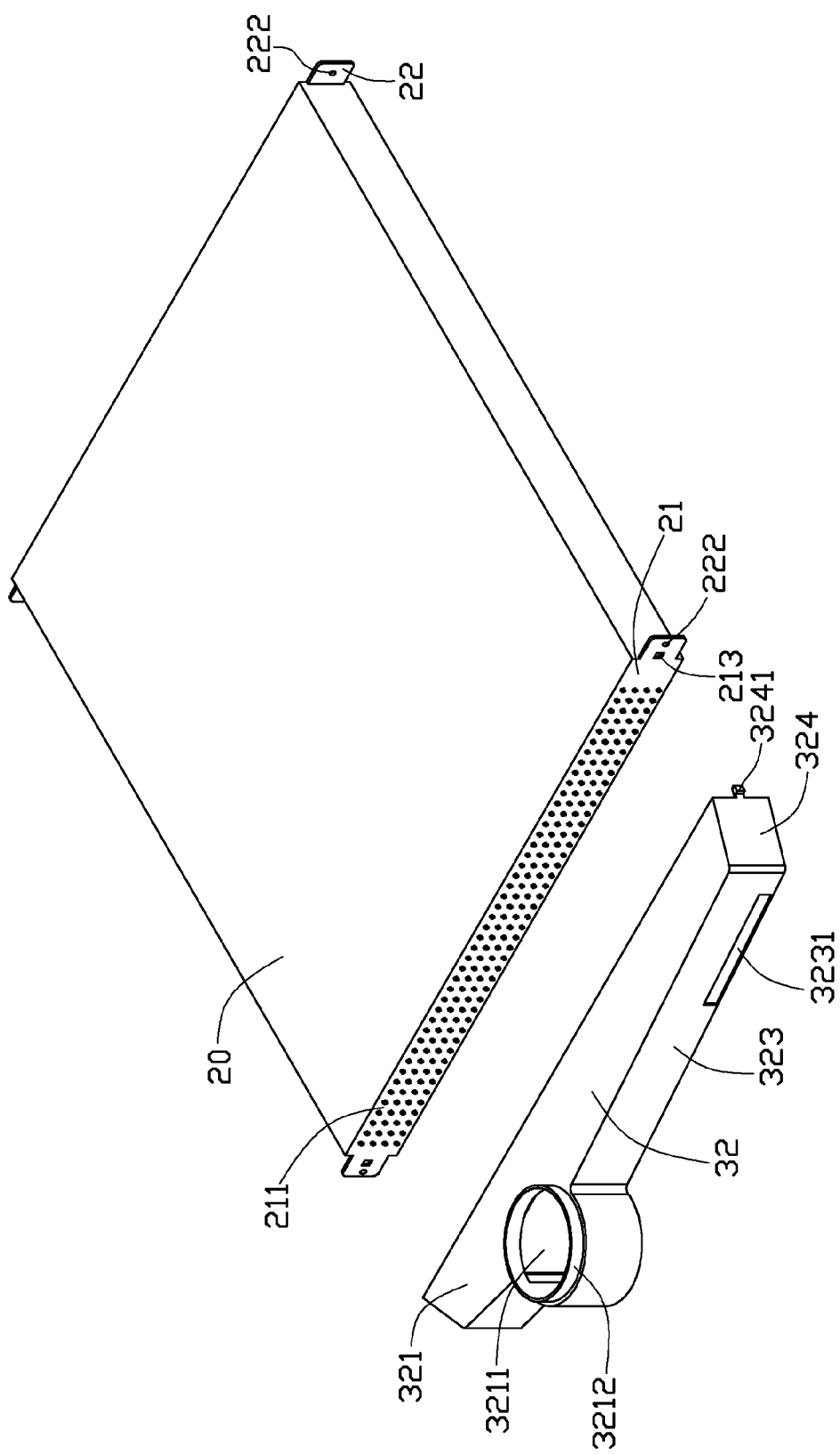
FIG. 3 is an exploded, isometric view of an airflow duct and a server of FIG. 2.
Figure 4:
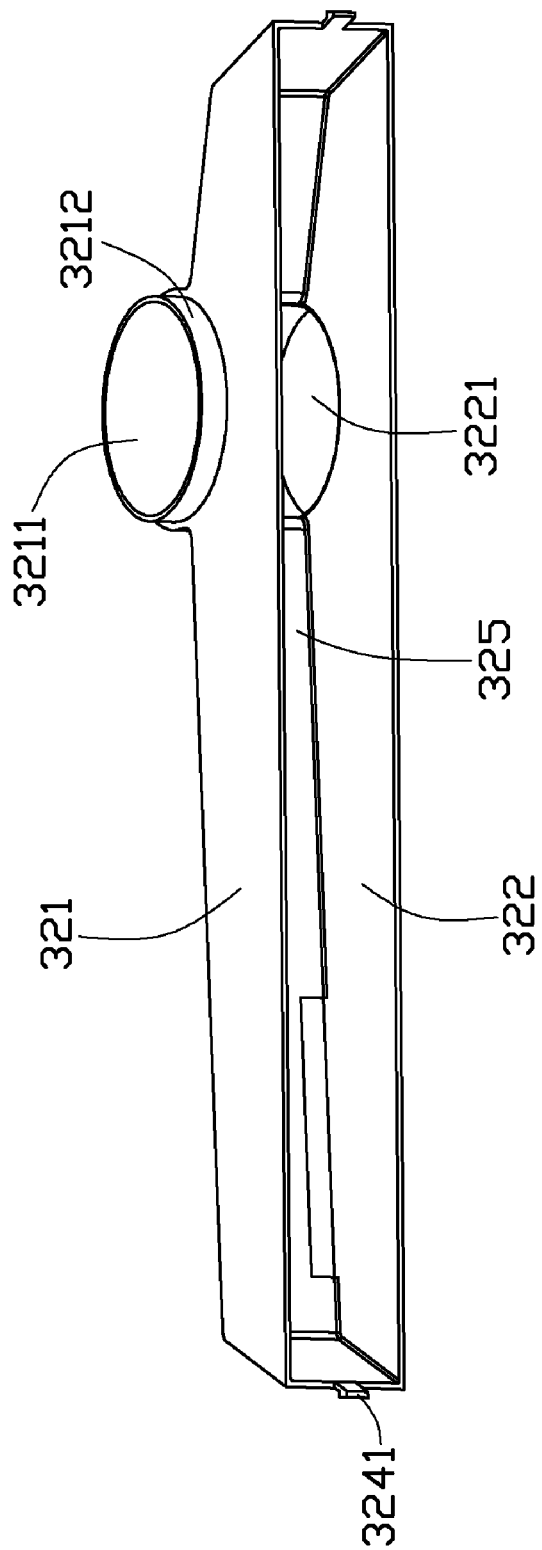
FIG. 4 is an isometric view of the airflow duct of FIG. 3.
Figure 5:
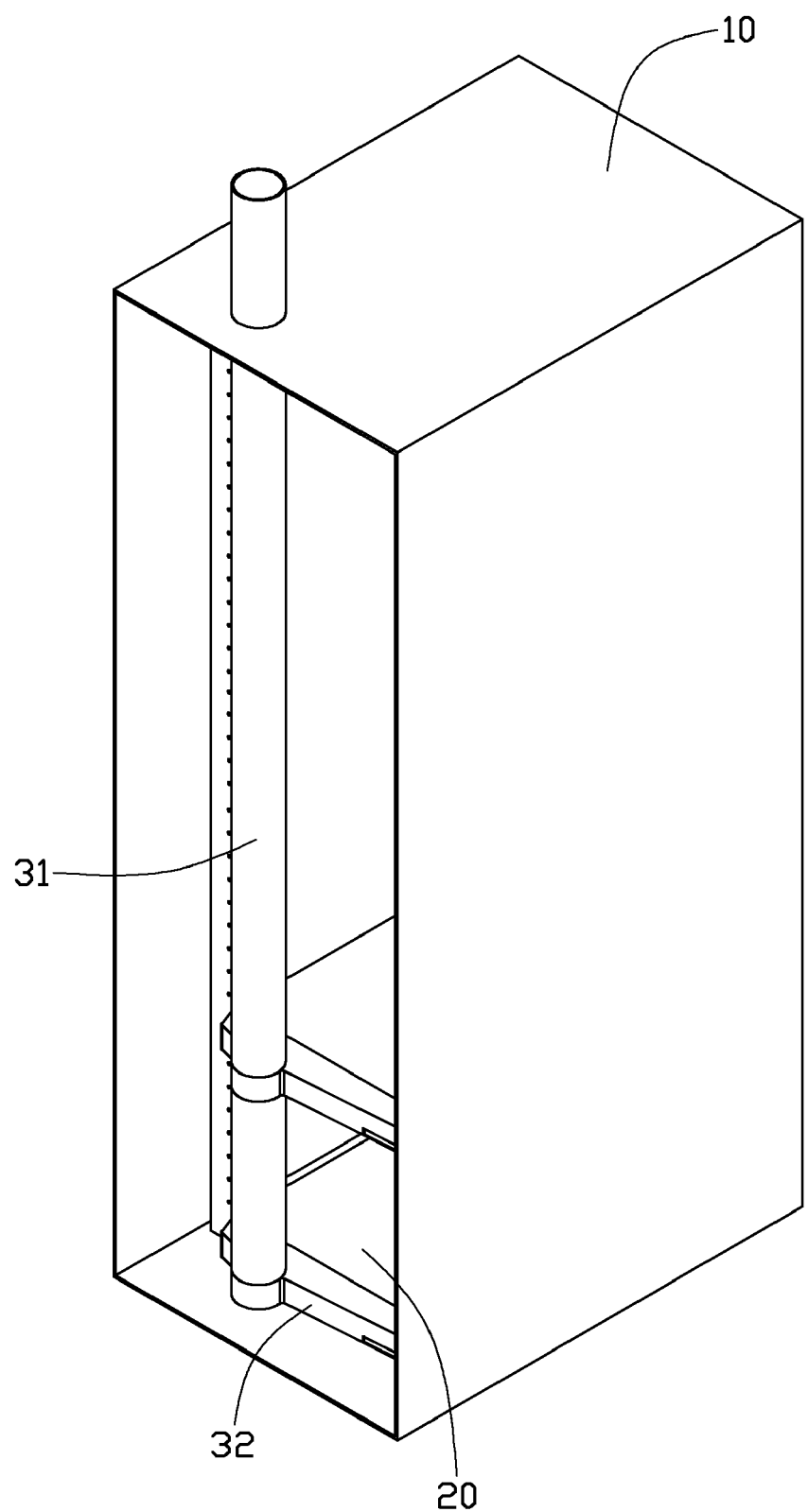
FIG. 5 is an assembled view of the disk drive assembly of FIG. 2.

Referring to FIGS. 2 to 4, each server assembly 100 includes a server cabinet 10, two servers 20, and an airflow guiding device 30.

The server cabinet 10 includes a bottom panel 11, two side panels 12 perpendicular to the bottom panel 11, and a top panel 13 parallel to the bottom panel 11. Each side panel 12 includes a mounting edge 121 extending towards the other side panel 12. A plurality of mounting holes 1211 is defined in each mounting edge 121. A through hole 131 is defined in the top panel 13.

The airflow guiding device 30 includes an airflow guiding pipe assembly 31 and two airflow ducts 32 connected to the airflow guiding pipe assembly 31. Each airflow duct 32 corresponds to a server 20.

The airflow guiding pipe assembly 31 includes a first airflow guiding pipe 311 and a second airflow guiding pipe 312. The extending direction of the first or second airflow guiding pipe 311, 312 is perpendicular to the bottom panel 11 of the server cabinet 10. The first airflow guiding pipe 311 is located between one airflow duct 32 an airflow generating device (not shown), such as a fan. The first airflow guiding pipe 311 is capable of extending through the through hole 131 of the server cabinet 10. The second airflow guiding pipe 312 is capable of being located between the two airflow ducts 32. The airflow guiding pipe assembly 31 is configured to guide airflow from the airflow generating device to the two airflow ducts 32. In one embodiment, the airflow guiding device 30 includes three airflow ducts 32 and the airflow guiding pipe assembly 31 includes two first airflow guiding pipe 311. Each first airflow guiding pipe 311 is located between two adjacent airflow duct 32. Additional airflow ducts 32 can be added as needed to accommodate additional servers.

Each airflow duct 32 includes a top plate 321, a bottom plate 322 parallel to the top plate 321, a first side plate 323 located between the top plate 321 and the bottom plate 322, and two second side plates 324 located between the top plate 321 and the bottom plate 322. An output opening 325 is cooperatively defined by the top plate 321, the bottom plate 322, and the two second side plates 324. An input opening 3211 is defined in the top plate 321. The top plate 321 includes a flange 3212 surrounding the input opening 3211. The flange 3212 is capable of being received in the first airflow guiding pipe 311 or the second airflow guiding pipe 312 to connect the first airflow guiding pipe 311 or the second airflow guiding pipe 312 to the airflow duct 32. A connecting opening 3221 is defined in the bottom plate 322. The connecting opening 3221 is aligned with the input opening 3211. The second airflow guiding pipe 312 is capable of being located between the connecting opening 3221 of one airflow duct 32 and the input opening 3211 of the other airflow duct 32. A slot 3231 is defined in the first side panel 323. A plurality of connecting cables (not shown) connected to the servers 20 is capable of being received in the slot 3231. Each second side plate includes a securing portion 3241 extending towards the corresponding server 20.

Each server 20 includes a front wall 21 and four mounting portions 22 extending from four corners of the server 20. A plurality of airflow input holes 211 is defined in the front wall 21. The airflow input holes 211 respectively correspond to the output opening 325 of the corresponding airflow duct 32. A second mounting hole 222 corresponding to one of the first mounting holes 1211 of the server cabinet 10 is defined in each mounting portion 22. Two securing holes 213 are defined in the front wall 21 corresponding to the securing portions 3241 of the airflow duct 32.

Referring to FIGS. 2 through 5, in assembly, the second mounting holes 222 of the servers 20 are respectively aligned with the first mounting holes 1211 of the server cabinet 10. A plurality of securing elements (not shown), such as screws, is secured into the second mounting holes 222 and the corresponding first mounting holes 1211, thereby securing the servers 20 to the server cabinet 10. The first airflow guiding pipe 311 is connected to the input opening 3211 of one airflow duct 32 and extends through the through hole 131 of the server cabinet 10. The second airflow guiding pipe 312 is located between two airflow ducts 32. The securing portions 3241 respectively engage with the corresponding securing holes 213 of the servers 20.

Figure 6:
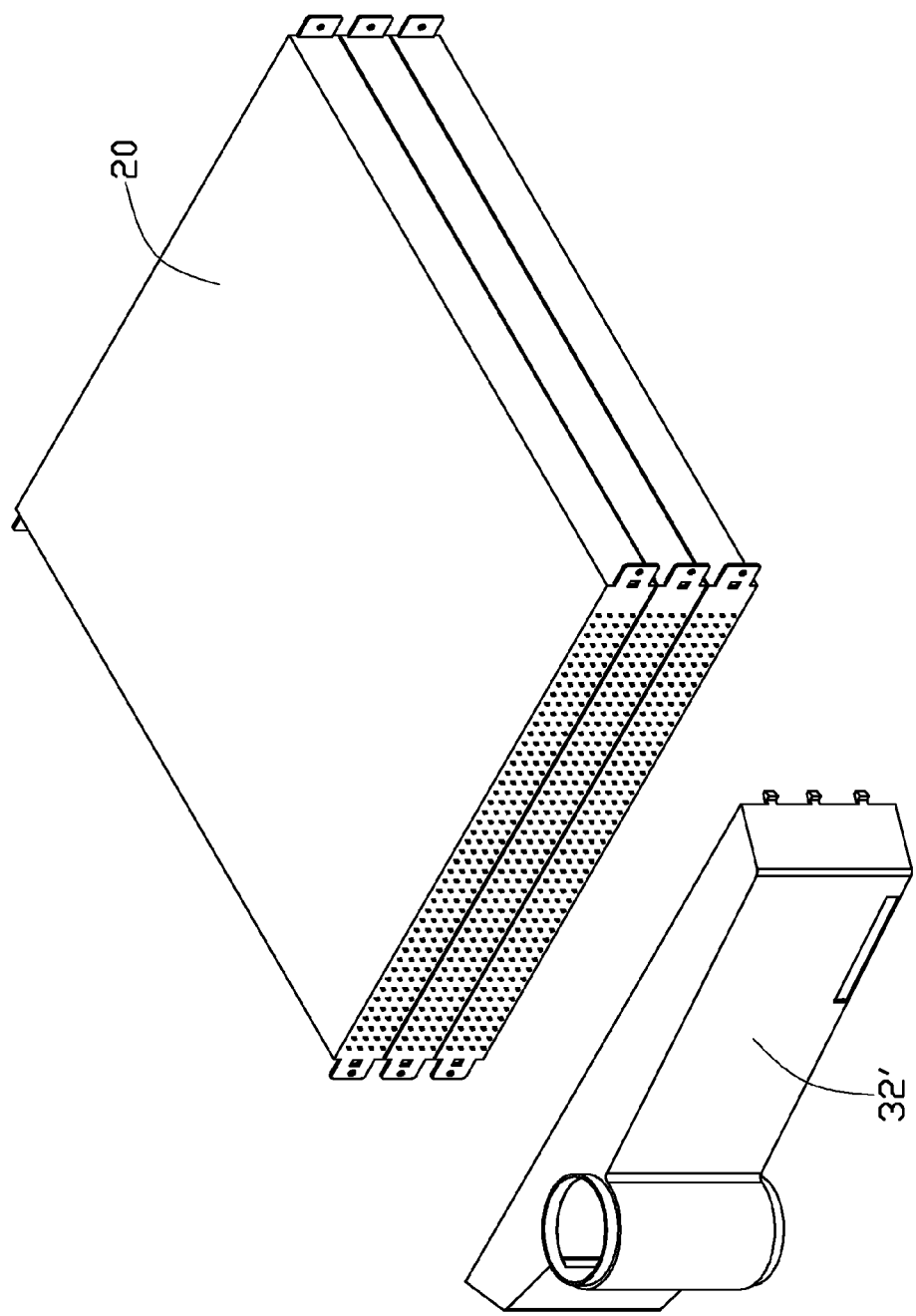
FIG. 6 is an isometric view of an airflow duct of another embodiment.

Referring to FIG. 6, an airflow duct 32' is designed to correspond to a server module including three servers 20. The airflow duct 32' can also be designed with different sizes to correspond to servers with different sizes.

The airflow producing device 400 produces and guides airflow to the main airflow guiding pipe 200 via the main airflow duct 300. Then air flows to the servers 20 via the airflow guiding devices 30 to dissipate heat from the servers 20. Heat dissipation efficiency of the server heat dissipation system is high because of cooperative heat dissipation. Additionally, little noise is produced in the server assemblies 100 because the airflow producing device 400 is away from the server assemblies 100.

It is to be understood, however, that even though numerous characteristics and advantages of the present disclosure have been set forth in the foregoing description, together with details of the structure and function of the disclosure, the disclosure is illustrative only, and changes may be made in detail, especially in matters of shape, size, and arrangement of parts within the principles of the disclosure to the full extent indicated by the broad general meaning of the terms in which the appended claims are expressed.

What is claimed is:

1. A server heat dissipation system, comprising:
   two server assemblies, each of the two server assemblies comprising:
      a server cabinet configured to receive a server; and
      an airflow guiding device comprising a first airflow guiding pipe and an airflow duct, the first airflow guiding pipe being connected to the airflow duct, the airflow duct being secured to the server and configured to guide airflow to the sever;
   an airflow producing device configured to produce airflow; and
   a main airflow guiding pipe connected to the first airflow guiding pipes to guide the airflow from the airflow producing device to the airflow ducts.

2. The server heat dissipation system of claim 1, wherein the two server assemblies are disposed in a room, and the airflow producing device is disposed outside of the room.

3. The server heat dissipation system of claim 1, wherein the main airflow guiding pipe is connected to the airflow producing device via a main airflow duct.

4. The server heat dissipation system of claim 3, wherein the main airflow duct is funnel-shaped.

5. The server heat dissipation system of claim 1, wherein the airflow producing device comprises a fan and an air filter, the fan is configured to guide the airflow from the air filter to the main airflow guiding pipe.

6. The server heat dissipation system of claim 1, wherein the server cabinet comprises a bottom panel, a top panel parallel to the bottom panel, and two side panels perpendicular to the bottom panel; and a through hole is defined in the top panel, and the first airflow guiding pipe extends through the through hole and is connected to the main airflow guiding pipe.

7. The server heat dissipation system of claim 6, wherein the first airflow guiding pipe is perpendicular to the bottom panel.

8. The server heat dissipation system of claim 1, wherein a slot is defined in the airflow duct, and the slot is configured to receive a connecting cable that is connected to the server.

9. The server heat dissipation system of claim 1, wherein the airflow duct comprises a flange surrounding an input opening defined in the airflow duct, and the flange is received in the first airflow guiding pipe to connect the airflow duct with the first airflow guiding pipe.

10. The server heat dissipation system of claim 1 wherein the server cabinet comprises two parallel side panels, each of the two side panels comprising a mounting edge extending towards each other, a plurality of first mounting holes defined in the mounting edge, a plurality of second mounting holes defined in the server corresponding to the plurality of first mounting holes; and a securing element is secured into each of the second mounting holes and each of the plurality of first mounting holes are to secure the first server to the server cabinet.

11. A server heat dissipation system, comprising:
   a server assembly, the server assembly comprising:
      a server cabinet;
      a first sever, the first server mounted in the server cabinet; and
      an airflow guiding device, comprising a first airflow guiding pipe and a first airflow duct, the first airflow guiding pipe being connected to the first airflow duct, the first airflow duct being secured to the first server and being configured to guide airflow to the first server;
   an airflow producing device configured to produce airflow; and
   a main airflow guiding pipe connected to the first airflow guiding pipe to guide the airflow from the airflow producing device to the first airflow duct.

12. The server heat dissipation system of claim 11, wherein the first server comprises a front wall, and an input hole is defined in the front wall; a first input opening and a first output opening are defined in the first airflow duct; the first output opening corresponds to the input hole so as to guide the airflow into the first server; the first airflow guiding pipe is located between the first input opening and the main airflow guiding pipe, and the first airflow guiding pipe is configured to guide the airflow from the main airflow guiding pipe to the first airflow duct.

13. The server heat dissipation system of claim 12, wherein the server assembly further comprises a second server, a second airflow guiding pipe, and a second airflow duct; a connecting opening is defined in the first airflow duct; a second input opening and a second output opening are defined in the second airflow duct, the second output opening is directed towards the second server, the second airflow guiding pipe is located between the connecting opening and the second input opening, and the second airflow guiding pipe is configured to guide the airflow from the first airflow duct to the second airflow duct.

14. The server heat dissipation system of claim 13, wherein the connecting opening is aligned with the first input opening.

15. The server heat dissipation system of claim 12, wherein the first airflow duct covers the front wall.

16. The server heat dissipation system of claim 12, wherein a securing hole is defined in the front wall, and the first airflow duct comprises a securing portion that engages the securing hole.

17. The server heat dissipation system of claim 12, wherein the first airflow duct comprises a top plate, a bottom plate, and two side plates; the first output opening is cooperatively defined by the top plate, the bottom plate, and the two side plates; and each of the two side plates comprises a securing portion extending towards the first server and two securing holes that are defined in the front wall, and each of the two securing holes is engaged in the securing portion.

18. An apparatus comprising:
   a plurality of server assemblies, each server assembly comprising:
      a server cabinet; a server and
      an airflow guiding device comprising a first airflow guiding pipe and a airflow duct, the first airflow guiding pipe being connected to the airflow duct, the airflow duct being secured and configured to guide airflow to the sever;

an airflow producing device; and a main airflow guiding pipe connected to the first airflow guiding pipe to guide the airflow from the airflow producing device to the airflow duct.

19. The apparatus of claim 18, wherein the server comprises a front wall, and an input hole defined in the front wall; a first input opening and a first output opening are defined in the airflow duct; the first output opening corresponds to the input hole so as to guide the airflow into the server; the first airflow guiding pipe is located between the first input opening and the main airflow guiding pipe, and the first airflow guiding pipe is configured to guide the airflow from the main airflow guiding pipe to the airflow duct.

20. The apparatus of claim 19, wherein the airflow duct comprises a top plate, a bottom plate, and two side plates; the first output opening is cooperatively defined by the top plate, the bottom plate, and the two side plates; and each of the two side plates comprises a securing portion extending towards the first server and two securing holes that are defined in the front wall, each of the two securing holes is engaged in the securing portion.

* * * * *